(12) United States Patent
Chen

(10) Patent No.: US 10,847,578 B1
(45) Date of Patent: Nov. 24, 2020

(54) THREE-DIMENSIONAL RESISTIVE MEMORIES AND METHODS FOR FORMING THE SAME

(71) Applicant: WINBOND ELECTRONICS CORP., Taichung (TW)

(72) Inventor: Frederick Chen, Tainan (TW)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/502,833

(22) Filed: Jul. 3, 2019

(51) Int. Cl.
*H01L 27/24* (2006.01)
*H01L 45/00* (2006.01)

(52) U.S. Cl.
CPC ...... *H01L 27/2481* (2013.01); *H01L 45/1253* (2013.01); *H01L 45/146* (2013.01); *H01L 45/1608* (2013.01); *H01L 45/1675* (2013.01)

(58) Field of Classification Search
CPC ............ H01L 27/2481; H01L 21/8221; H01L 45/1253; H01L 45/146; H01L 45/1608; H01L 45/1675

USPC ............................................................ 257/5
See application file for complete search history.

(56) References Cited

U.S. PATENT DOCUMENTS 10,056,432 B2    8/2018    Hou et al.
10,741,760 B2 *   8/2020    Park ...................... H01L 27/249

* cited by examiner

*Primary Examiner* — Tu-Tu V Ho
(74) *Attorney, Agent, or Firm* — Muncy, Geissler, Olds & Lowe, P.C.

(57) ABSTRACT

A three-dimensional resistive memory is provided. The three-dimensional resistive memory includes a resistive switching pillar, an electrode pillar disposed within the resistive switching pillar, a stack of bit lines adjacent to the resistive switching pillar, a plurality of sidewall contacts between each of the bit lines and the resistive switching pillar, and a selector pillar extending through the stack of bit lines. The bit lines are separated vertically from each other by an insulating layer. The selector pillar contacts each of the sidewall contacts.

20 Claims, 8 Drawing Sheets

THREE-DIMENSIONAL RESISTIVE MEMORIES AND METHODS FOR FORMING THE SAME

BACKGROUND

Technical Field

The disclosure relates to three-dimensional resistive memories and methods for forming the same.

Description of the Related Art

Resistive random access memory (RRAM) is one type of non-volatile memory. Due to the numerous advantages of RRAM, which include its simple structure, low operation voltage, rapid operation time, multi-bit storage, low cost, and good durability, RRAM have been widely developed recently. The basic structure of a commonly used RRAM is composed of one transistor and one resistor (1T1R). The resistance value of the resistor can be changed by varying the applied bias, so that the device can be in a high resistance state or a low resistance state, and thereby 0 or 1 of the digital signal is recognized.

Non-volatile memory is expanding into a three-dimensional regime to effectively reduce the cell size by increasing the stored bits per unit area. One common three-dimensional memory is a cross point array memory. However, the method for forming a cross point array memory is complicated and expensive because it requires repeated patterning of individual device layers. Moreover, the sneak current and accidental RESET or SET disturbance of non-selected memory cells can occur, so the reliability of the device is compromised.

Although existing three-dimensional resistive memories and methods for manufacturing the same have been adequate for their intended purposes, they have not been entirely satisfactory in all aspects. Therefore, up to the present, there are still some problems to be overcome in regards to the technologies of three-dimensional resistive memories.

BRIEF SUMMARY OF THE DISCLOSURE

Some embodiments of the disclosure provide a three-dimensional resistive memory. The three-dimensional resistive memory includes a resistive switching pillar, an electrode pillar disposed within the resistive switching pillar, a stack of bit lines adjacent to the resistive switching pillar, a plurality of sidewall contacts between each of the bit lines and the resistive switching pillar, and a selector pillar extending through the stack of bit lines. The bit lines are separated vertically from each other by an insulating layer. The selector pillar contacts each of the sidewall contacts.

Some embodiments of the disclosure provide a method for manufacturing a three-dimensional resistive memory. The method includes forming a stack structure on a substrate, wherein the stack structure includes a plurality of conductive layers and a plurality of insulating layers alternately stacked; patterning the stack structure to form a first stack portion and a second stack portion perpendicular to the first stack portion, wherein the first stack portion together with the second stack portion form a T-shape from a top-view aspect, and wherein the first stack portion comprises a stack of bit lines separated vertically from each other by the insulating layers, and the second stack portion includes a plurality of sidewall contacts separated vertically from each other by the insulating layers; forming an isolation layer on the substrate bordering the first stack portion and the second stack portion; etching the isolation layer to form a first via opening exposing a first end of the second stack portion; sequentially forming a resistive switching pillar and an electrode pillar in the first via opening; etching the first stack portion to form a second via opening extending through the stack of bit lines and exposing a second end of the second stack portion; and forming a selector pillar in the second via opening, wherein the selector pillar contacts each of the sidewall contacts.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
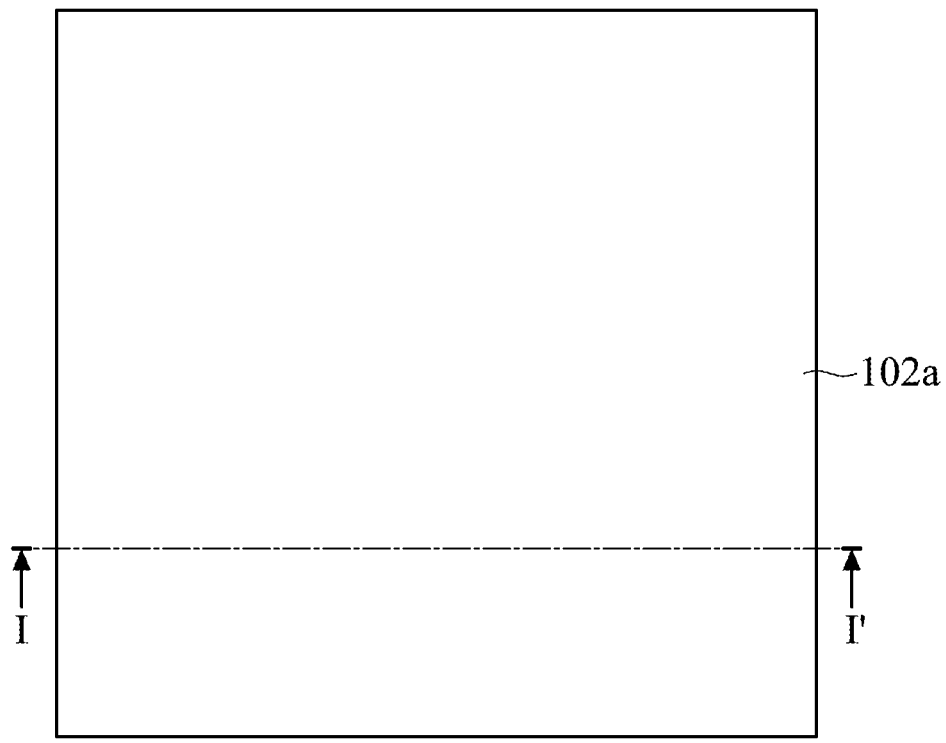
FIGS. 1A, 2A, 3, and 4A are top views illustrating intermediate stages of an example method for forming the three-dimensional resistive memory in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to a value of an error or a range within 40 percent, preferably within 20 percent, and more preferably within 10 percent, within 5 percent, within 3 percent, within 2 percent, or within 1 percent. If there is no specific description, the mentioned values are regarded as an approximation that is the error or the range expressed as "about", "approximate", or "substantially".

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features and for ease of depicting the figures.

Embodiments of three-dimensional resistive memories and methods for forming the same are provided, especially a three-dimensional resistive memory with a selector. In some embodiments of the present disclosure, a selector pillar, rather than a transistor, is used to control the current direction, and the driving current is increased since there is no need to use poly-silicon as a channel material. The selector pillar may reduce the sneak current, and therefore the performance of the three-dimensional resistive memory is improved. Furthermore, the three-dimensional resistive memory with the selector pillar in the embodiment of the present disclosure may be formed with simpler process steps as compared to those with the transistor. A method for forming the three-dimensional resistive memory according to an embodiment of the present disclosure will be discussed in the following of the present disclosure.

Figure 1B:
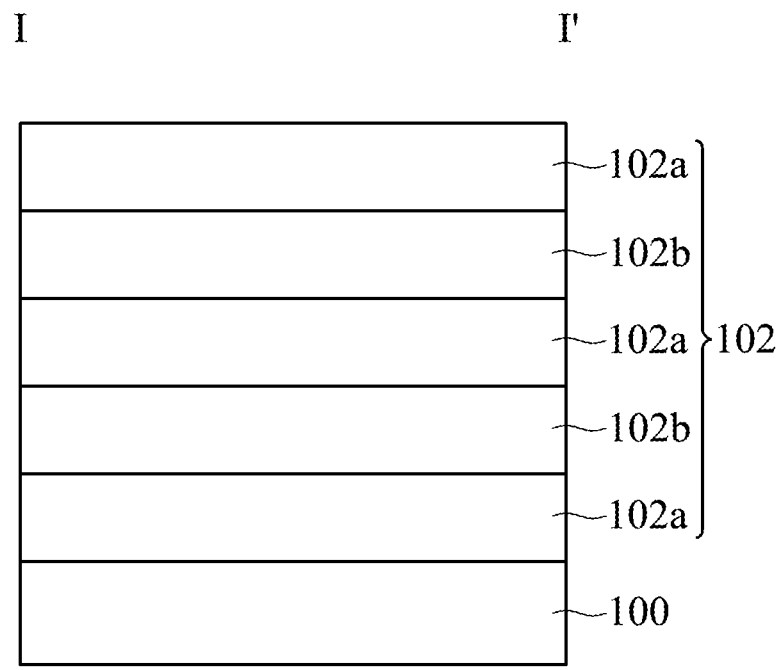
FIG. 1B is a cross-sectional view taken along line I-I' of FIG. 1A in accordance with an embodiment of the present disclosure.
Figure 2A:
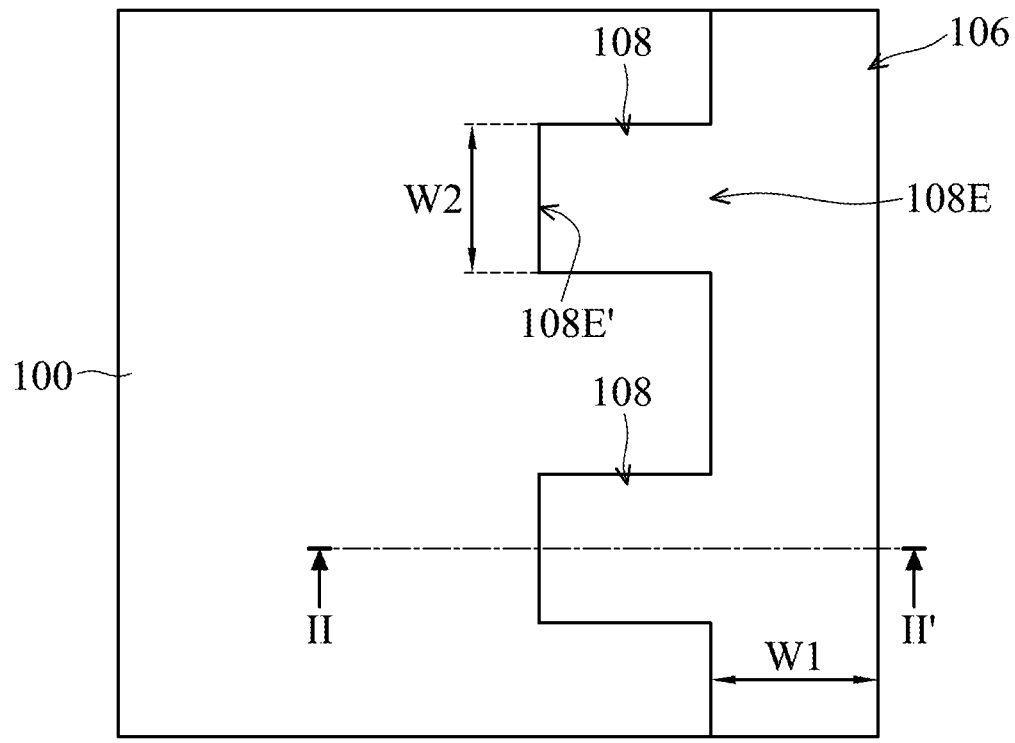
Figure 2B:
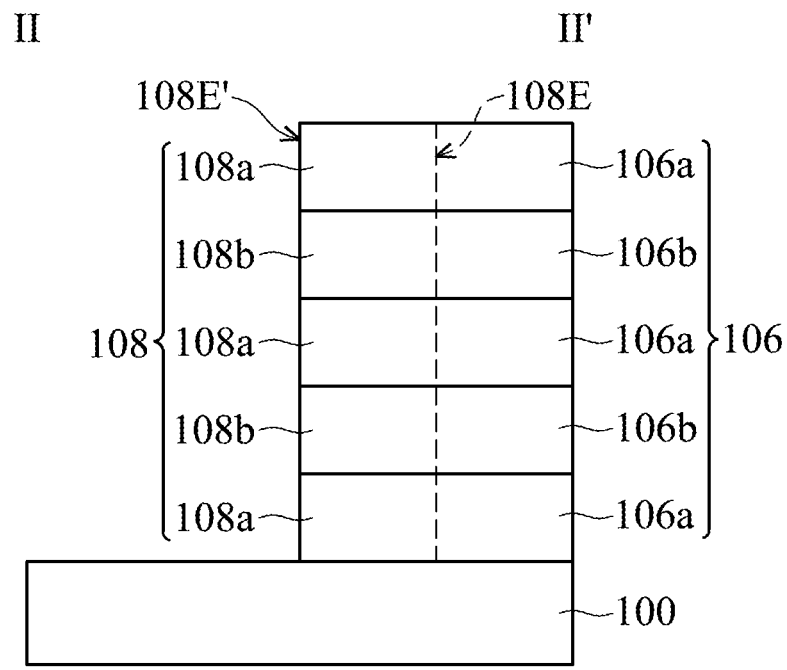
FIG. 2B is a cross-sectional view taken along line I-II' of FIG. 2A in accordance with an embodiment of the present disclosure.
Figure 3:
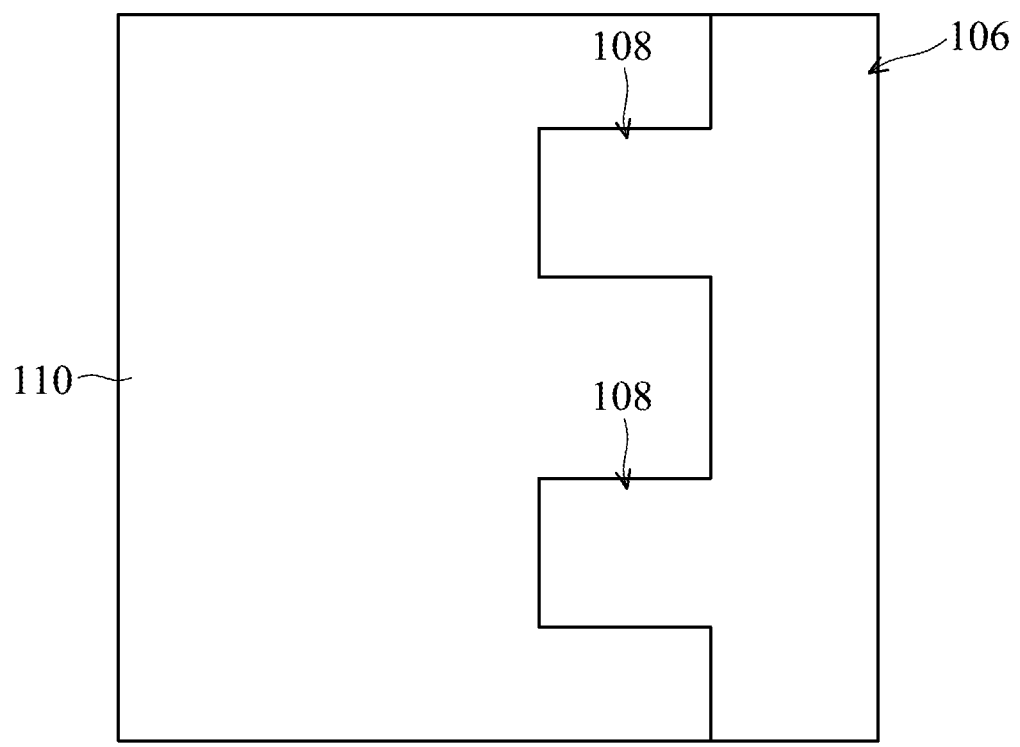
Figure 4A:
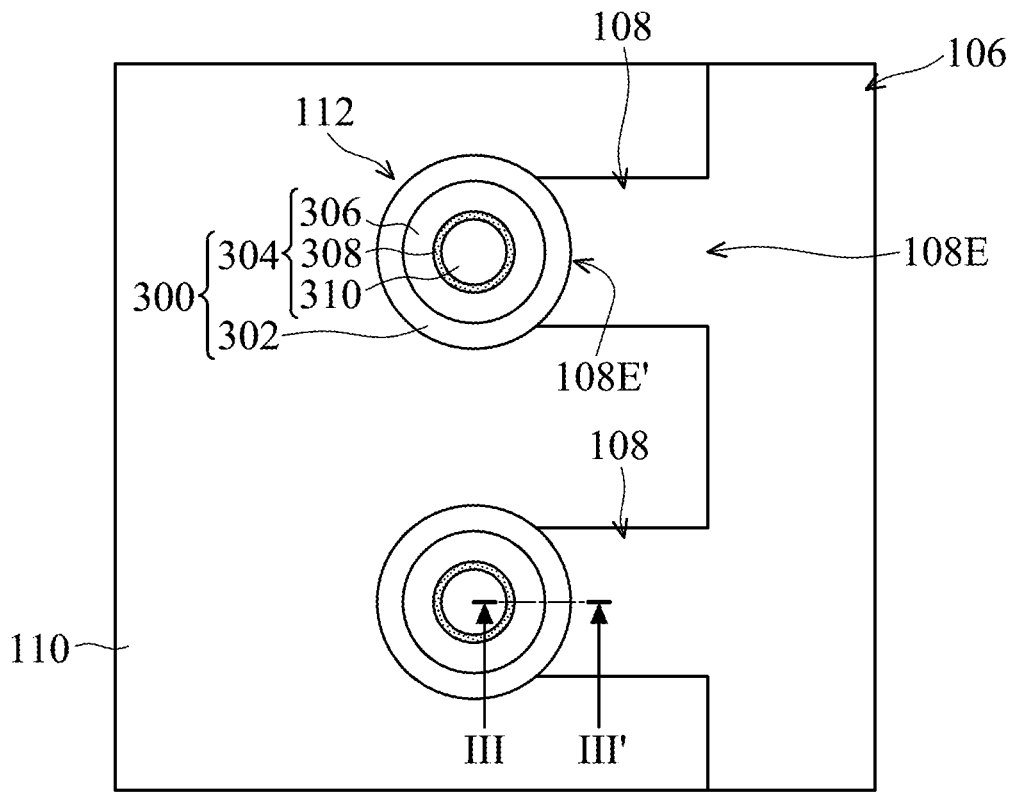
Figure 4B:
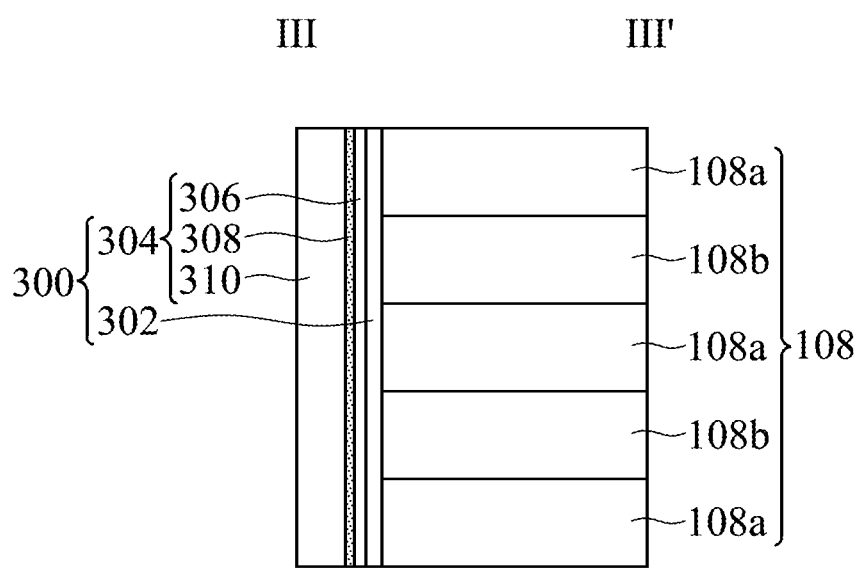
FIGS. 4B, 4C and 4D are cross-sectional views taken along line III-III' of FIG. 4A in accordance with different embodiments of the present disclosure.
Figure 4C:
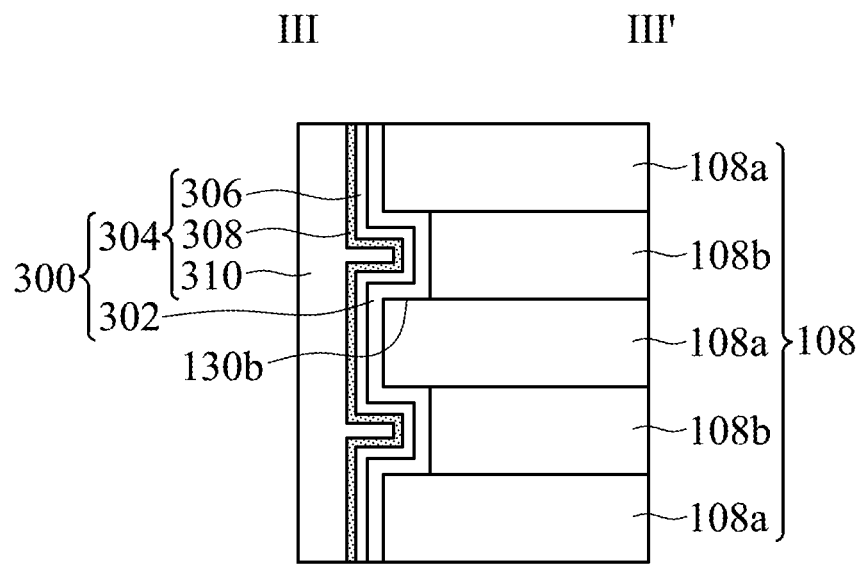
Figure 4D:
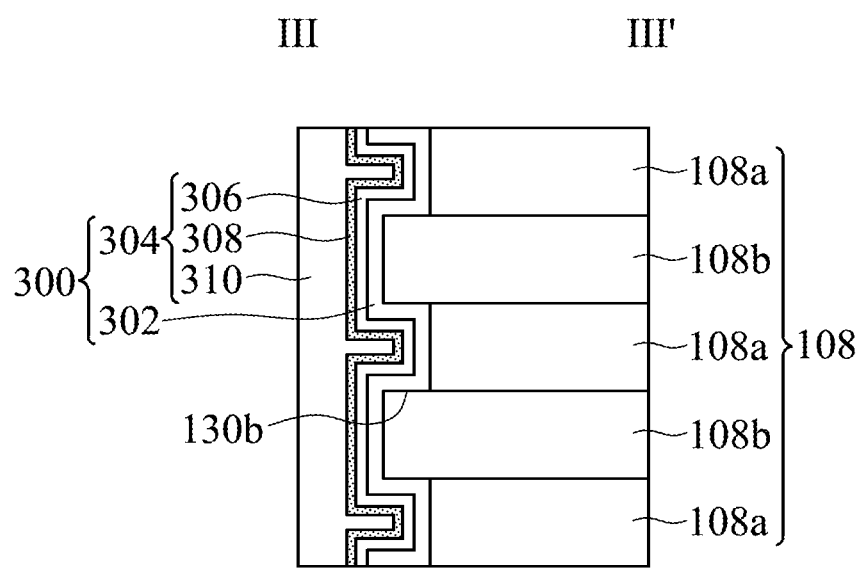
Figure 5A:
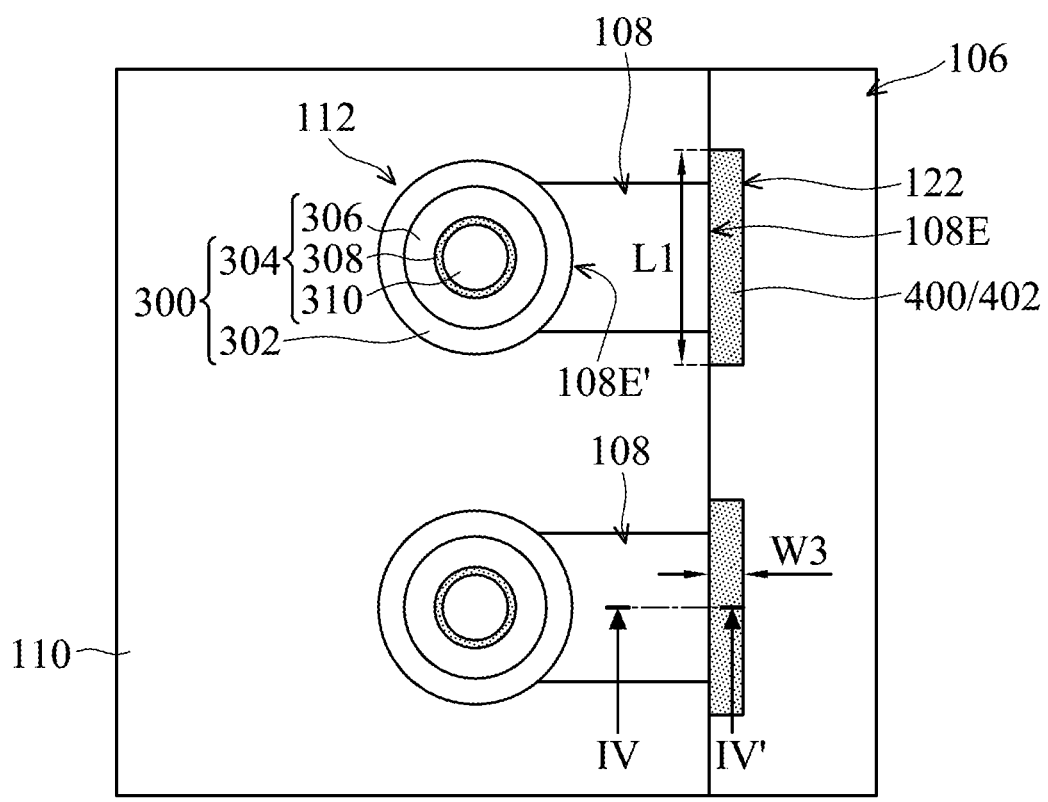
FIGS. 5A and 6A are top views illustrating intermediate stages of an example method for forming the three-dimensional resistive memory in accordance with different embodiments of the present disclosure
Figure 5B:
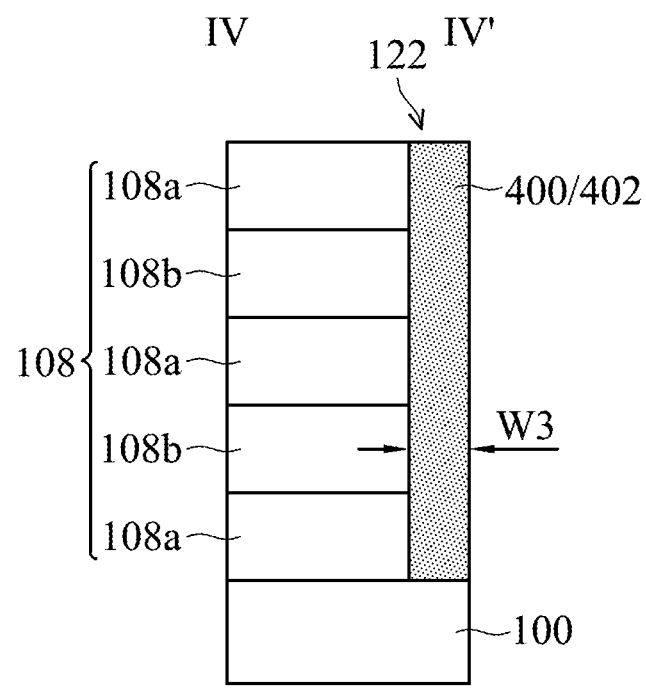
FIG. 5B is a cross-sectional view taken along line IV-IV' of FIG. 5A in accordance with an embodiment of the present disclosure.
Figure 6A:
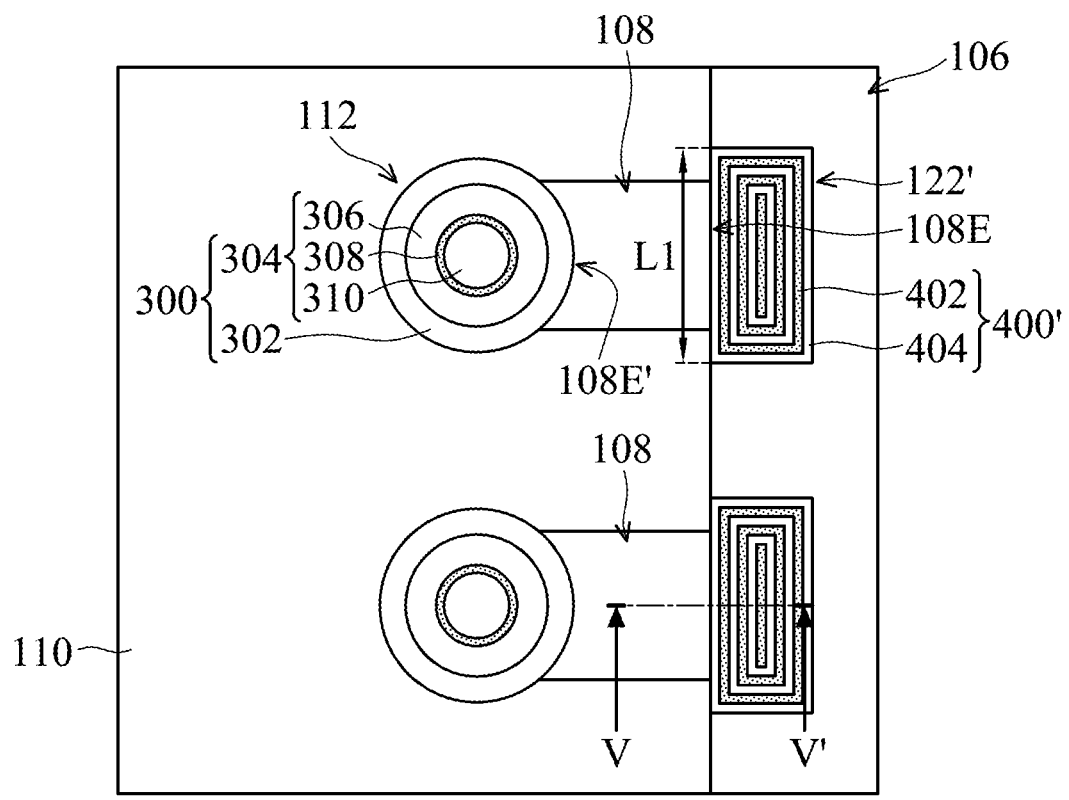
Figure 6B:
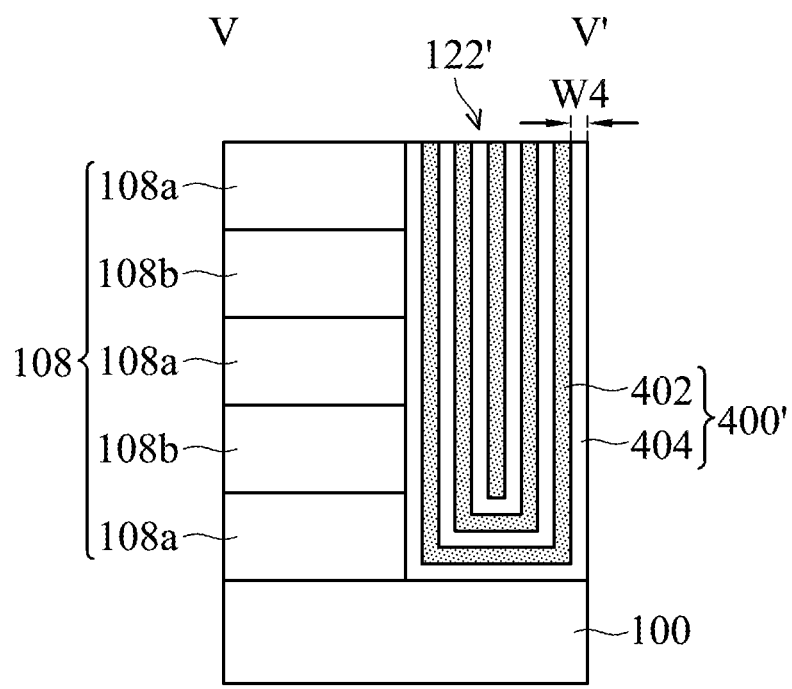
FIG. 6B is a cross-sectional view taken along line V-V' of FIG. 6A in accordance with an embodiment of the present disclosure.
Figure 7:
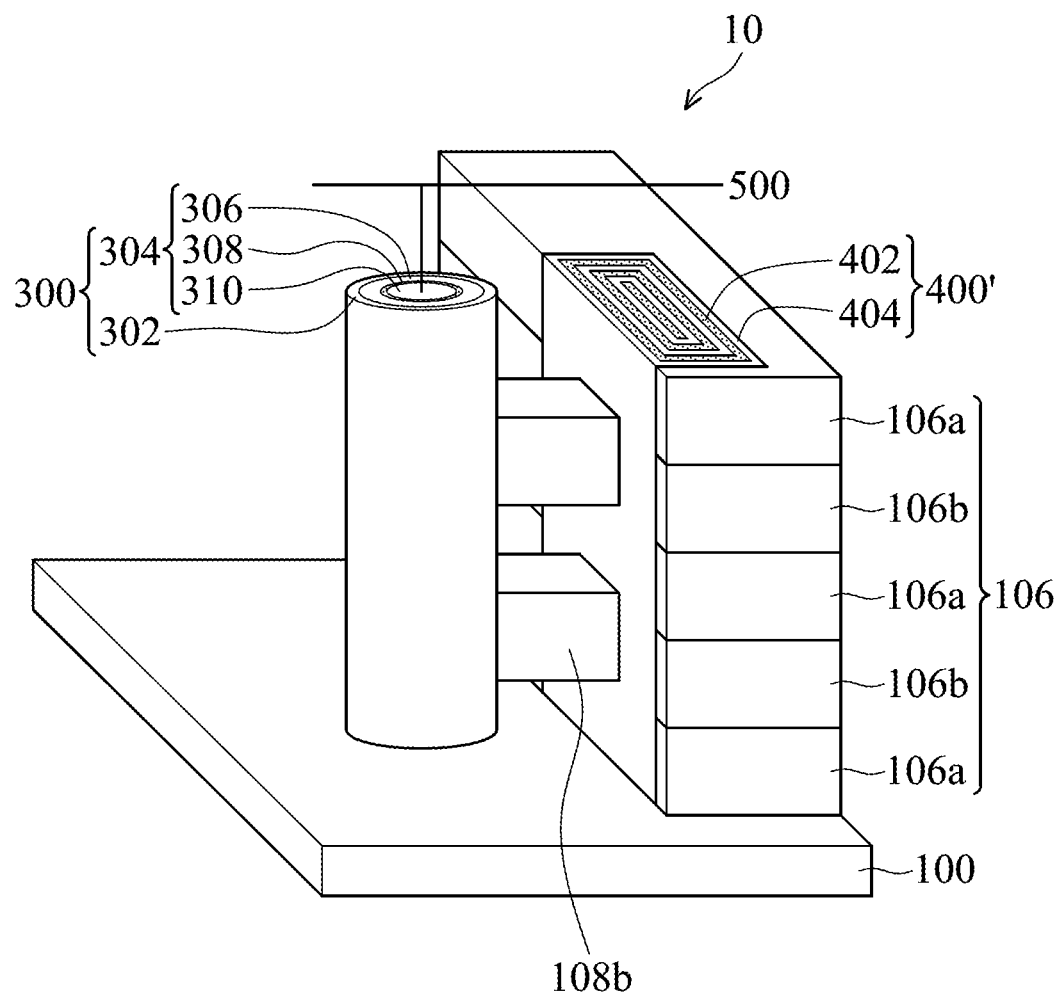
FIG. 7 is a perspective view of the three-dimensional resistive memory in accordance with some embodiments of the present disclosure.

FIGS. 1A, 2A, 3, 4A, 5A and 6A are top views illustrating intermediate stages of an example method for forming the three-dimensional resistive memory 10 of FIG. 7 in accordance with some embodiments of the present disclosure, wherein FIG. 1B is a cross-sectional view taken along line I-I' of FIG. 1A, FIG. 2B is a cross-sectional view taken along line II-II' of FIG. 2A. In addition, FIGS. 4B, 4C and 4D are cross-sectional views taken along line III-III' of FIG. 4A in accordance with different embodiments. Furthermore, FIG. 5B is a cross-sectional view taken along line IV-IV' of FIG. 5A, and FIG. 6B is a cross-sectional view taken along line V-V' of FIG. 6A.

FIG. 1A illustrates an initial step of a method for forming the three-dimensional resistive memory 10 according to an embodiment of the present disclosure, and FIG. 1B is a cross-sectional view taken along line I-I' of FIG. 1A. As shown in FIGS. 1A and 1B, a stack structure 102 is formed on a substrate 100. In some embodiments, the substrate 100 may be a semiconductor substrate, such as a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof. Furthermore, the substrate 100 may be formed to include active elements and/or passive elements. The active elements may include transistors, diodes, and the like, and the passives elements may include resistors, capacitors, inductors, and the like.

As shown in FIG. 1B, the stack structure 102 includes a plurality of insulating layers 102a and a plurality of conductive layer 102b alternately stacked. In some embodiments, the insulating layers 102a may include or be oxide (such as silicon oxide), nitride (such as silicon nitride), or a combination thereof. For example, the insulating layer 102a has a thickness ranging from about 30 nm to about 200 nm. In some embodiments, the conductive layer 102b can include titanium nitride (TiN), tantalum nitride (TaN), tungsten (W), aluminum (Al), copper (Cu), cobalt (Co), nickel (Ni), or a combination thereof. For example, the conductive layer 102b has a thickness ranging from about 30 nm to about 400 nm.

In some embodiments, the method for forming the stack structure 102 includes alternately forming the insulating layers 102a and the conductive layer 102b with multiple deposition processes. For example, the insulating layers 102a may be formed by a chemical vapor deposition process (e.g., a low pressure chemical vapor deposition process, or a plasma enhanced chemical vapor deposition process), another applicable process, or a combination thereof. For example, the conductive layer 102b may be formed by a chemical vapor deposition process (e.g., a metalorganic chemical vapor deposition (MOCVD) process), a physical vapor deposition process (e.g., a vacuum evaporation process, or a sputtering process), another applicable process, or a combination thereof. FIG. 1B shows three insulating layers 102a and two conductive layers 102b for illustration purposes only, and the invention is not limited thereto. In other words, the numbers of the insulating layers 102a and the conductive layer 102b may be adjusted depending on the required characteristics of the actual product.

In some embodiments, an adhesive layer (not shown) may be provided between the insulating material layer 102a and the conductive layer 102b to promote adhesion there between. For example, the adhesive layer may be or include titanium nitride (TiN), tantalum nitride (TaN), titanium (Ti), or titanium tungsten (TiW). In some embodiments, the adhesive layer may be formed by a deposition process, such as a chemical vapor deposition process (e.g., a metalorganic chemical vapor deposition (MOCVD) process), a physical vapor deposition process (e.g., a vacuum evaporation process, or a sputtering process), an atomic layer deposition (ALD), another applicable process, or a combination thereof.

Next, as shown in FIG. 2A, a patterning process is performed on the stack structure 102 to expose a portion of the substrate 100 and form a first stack portion 106 and a plurality of second stack portions 108 connected to the first stack portion 106. As shown in FIG. 2A, an extension direction of the first stack portion 106 is perpendicular to an extension direction of second stack portions 108. In other words, the first stack portion 106 together with the second stack portion 108 form a T-shape from a top-view aspect, as shown in FIG. 2A. As shown in FIG. 2A, the second stack portion 108 has a first end 108E adjoining the first stack portion 106 and a second end 108E' opposite to the first 108E. In some embodiments, the first stack portion 106 has a first width W1 (see FIG. 2A) ranging from about 100 nm to about 300 nm. In some embodiments, the second stack portions 108 has a second width W2 (see FIG. 2A) ranging from about 100 nm to about 300 nm.

FIG. 2B is a cross-sectional view taken along line II-II' of FIG. 2A. As shown in FIG. 2B, the first stack portion 106 includes a stack of bit lines 106b separated vertically from each other by the insulating layers 106a (i.e. the patterned insulating layers 102a in the first stack portion 106, and the second stack portion 108 includes a plurality of sidewall contacts 108b separated vertically from each other by the insulating layers 108a (i.e. the patterned insulating layers 102a in the second stack portions 108). FIG. 2A shows two second stack portions 108 connecting to one first stack portion 106 for illustration purposes only, and the invention is not limited thereto. In other words, the numbers of the second stack portion 108 may be adjusted depending on the required characteristics of the actual product.

In some embodiments, the patterning process may include a lithography process and an etching process. The lithography process may include photoresist coating (e.g., spin-coating), soft baking, exposure, post-exposure baking, photoresist developing, rinsing and drying (e.g., hard baking), another applicable process, or a combination thereof. The etching process may include such as a wet etching process, a dry etching process (e.g., reactive ion etch (RIE), plasma etching, or ion milling), another applicable process, or a combination thereof.

FIG. 3 illustrates the formation of an isolation layer 110. The isolation layer 110 is formed on the exposed portion of the substrate 100, bordering the first stack portion 106 and the second stack portion 108. In some embodiments, the isolation layer 110 may be or include an insulating material, such as oxide (such as silicon oxide), nitride, or a combination thereof. The insulating material may be formed on the substrate 100 by a high density plasma chemical vapor deposition (HDP-CVD), a flowable chemical vapor deposition (FCVD), or any applicable deposition process. Then, a planarization process (e.g., chemical-mechanical-polishing (CMP) process or a grinding process) may be performed to level a top surface of the isolation layer 110 with top surfaces of the first stack portion 106 and the second stack portion 108.

Next, referring to FIGS. 4A and 4B, FIG. 4B is a cross-sectional view taken along line III-III' of FIG. 4A in accordance with some embodiments of the present disclosure. As show in FIGS. 4A and 4B, a via opening 112 is formed in the isolation layer 110, wherein the via opening 112 exposes the second end 108E' of the second stack portion 108 and goes at least as deep as the whole stack of bit lines 106b. In some embodiments, the via opening 112 extends down to a top surface of the substrate 100 and exposes a portion of the substrate 100. In other embodiments, the via opening 112 does not expose the substrate 100.

In some embodiments, the via opening 112 may be formed in the isolation layer 110 by a patterning process. For example, the patterning process may include a lithography process (e.g., photoresist coating, soft baking, mask aligning, exposure, post-exposure baking, developing photoresist, another applicable process, or a combination thereof), an etching process (e.g., a wet etching process, a dry etching process, another applicable process, or a combination thereof), another applicable process, or a combination thereof. In some embodiments, a patterned photoresist layer (not shown) having an opening corresponding to the via opening 112 may be formed on the isolation layer 110 by a lithography process, and then an etching process may be performed to remove a portion of the isolation layer 110 exposed by the opening of the patterned photoresist layer (not shown) to form the via opening 112 in the isolation layer 110. The via opening 112 may have any shape from the top view aspect, for example, circular shape (see FIG. 4A), rectangular shape (not shown), or another applicable shape.

Still referring to FIGS. 4A and 4B, a resistive switching pillar 302 and an electrode pillar 304 are sequentially formed in the via opening 112. According to some embodiments of the present disclosure, a combination of the resistive switching pillar 302 and the electrode pillar 304 disposed within the resistive switching pillar 302 together construct as a RRAM pillar 300.

In some embodiments, the resistive switching pillar 302 may be or include transition metal oxide, such as hafnium oxide, titanium oxide, tungsten oxide, tantalum oxide, zirconium oxide, another applicable materials, or a combination thereof, and a thickness of the resistive switching pillar 302 may be about 1 nm to about 50 nm. In some embodiments, the resistive switching pillar 302 may be formed conformally along sidewall and bottom surfaces of the via opening 112 by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), another applicable process, or a combination thereof.

In some embodiments, the step for forming the electrode pillar 304 includes forming, from periphery to center of the via opening 112, an ion exchange layer 306, a barrier layer 308 and an electrode layer 310 in sequence. In some embodiments, the ion exchange layer 306 may be an oxygen exchange layer. The ion exchange layer 306 can help the resistive switching pillar 302 to form filaments. Specifically, after forming the filaments in the resistive switching pillar 302, ionized oxygen ions can be stored in the ion exchange layer 306. Moreover, the barrier layer 308 can help to confine the ionized oxygen ions in the ion exchange layer 306, and allows more stable filaments formed in a memory cell and better filament reproducibility of the RRAM. In some embodiments, the ion exchange layer 306 may include aluminum (Al), titanium (Ti), tantalum (Ta), titanium oxide (TiOx), aluminum oxide (AlOx), or a combination thereof. For example, the ion exchange layer may be an AlOx/Ti or AlOx/TiOx bilayer. A thickness of the ion exchange layer 306 may be about 10 nm to about 50 nm, for example, about 20-30 nm. In some embodiments, the barrier layer 308 may include titanium oxynitride (TiON), aluminium oxide ($Al_2O_3$), silicon nitride ($SiN_4$), another applicable materials, or a combination thereof, and a thickness of the barrier layer 308 may be about 0.5 nm to about 10 nm. In some embodiments, the electrode layer 310 may include tungsten (W), platinum (Pt), aluminum (Al), titanium (Ti), titanium nitride (TiN), another applicable materials, or a combination thereof, and a thickness of the electrode layer 310 may be about 40 nm to about 80 nm. In some embodiments, the ion exchange layer 306, the barrier layer 308 and the electrode layer 310 may be formed sequentially by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), another applicable process, or a combination thereof.

In some embodiments, before the formation of the resistive switching pillar 302 and the electrode pillar 304, an etchant having a similar etching rate for the insulating layer 108a and the sidewall contact 108b is used during the step of removing the portion of the isolation layer 110 to form the via opening 112, so that the via opening 112 is formed with a substantially vertical sidewall or a smooth sidewall, as shown in FIG. 4B.

In other embodiments, an etchant having different etching rates for the insulating layer 108a and the sidewall contact 108b is used during the step of removing the portion of the isolation layer 110 to form the via opening 112, thereby forming a plurality of recesses between the stack portion 108 and the resistive switching pillar 302. The recesses are advantageous for hindering oxygen vertical diffusion or motion in the ion exchange layer 306, and therefore prevent crosstalk of different memory cells in a vertical direction. In an embodiment where the etching rate of the sidewall contact 108b is higher than the etching rate of the insulating layer 108a, each of the recesses 130a is located between adjacent insulating layers 108a, as shown in FIG. 4C. In an embodiment where the etching rate of the sidewall contact 108b is lower than the etching rate of the insulating layer 108a, each of the recesses 130b is located between adjacent sidewall contacts 108b, as shown in FIG. 4D.

Referring to FIGS. 5A and 5B, FIG. 5B is a cross-sectional view taken along line IV-IV' of FIG. 5A. As shown in FIGS. 5A and 5B, a via opening 122 is formed extending through the whole stack of bit lines 106b, and exposes the first end 108E of the second stack portion 108. In some embodiments, the via opening 122 exposes the entirety of the first end 108E of the second stack portion 108. The via opening 122 corresponds to the position of the selector pillar 400 to be formed. In some embodiments, the via opening 122 extends down to the top surface of the substrate 100 and exposes a portion of the substrate 100, as shown in FIG. 5A-1. In other embodiments, the via opening 122 does not expose the substrate 100 (not shown). The process for forming the via opening 122 may be similar to the process for forming the via opening 112, and therefore is not repeated here.

Still referring to FIGS. 5A and 5B, as mentioned before, a selector pillar 400 is formed in the via opening 122 and contacts each of the sidewall contacts 108b. The selector pillar 400 is a switching device used to reduce or avoid leakage current from an operating memory cell or from other memory cells passing along the resistive network. According to some embodiments of the present disclosure, the portion of the RRAM pillar 300 adjacent to the corresponding sidewall contact 108b, the sidewall contact 108b, the portion of the selector pillar 400 adjacent to the corresponding sidewall contact 108b, and the bit line 106b together serve as a memory cell. Since there is no need to use the poly silicon as the channel material, the three-dimensional resistive memory 10 with the selector pillar 400 of the present disclosure has a higher driving current as compared to those with the transistor. Furthermore, the three-dimensional resistive memory 10 with the selector pillar 400 in the embodiment of the present disclosure may be formed with simpler process steps as compared to those with the transistor.

In some embodiments, the selector pillar 400 includes oxide layer 402. The oxide layer 402 is made of an oxide material that can cause the Fowler-Nordheim tunneling effect, such as titanium oxide ($TiO_2$), zirconium oxide ($ZrO_2$), hafnium oxide ($HfO_2$), silicon dioxide ($SiO_2$), aluminum oxide ($Al_2O_3$), or a combination thereof. A Fowler-Nordheim tunneling barrier is obtained to achieve high nonlinear I-V curve and high current density, and therefore the selector pillar 400 is temperature-independent and the sneak current problem can be avoided.

In some embodiments, the selector pillar 400 completely fills the via opening 122 and has a length L1 along the extension direction of the first stack portion 106, and the length L1 ranges from about 50 nm to about 200 nm. In some embodiments, the length L1 of the selector pillar 400 is equal to the second width W2 of the second stack portion 108. In other embodiments, the length L1 of the selector pillar 400 is greater than the second width W2 of the second stack portion 108. In some embodiments, the selector pillar 400 may include the oxide layer 402 with a third width W3 ranging from about 0.3 nm to about 20 nm. When the third width W3 of the oxide layer 402 is too large (e.g. larger than 10 nm), the current may be too low or the required applied voltage may be too high.

In some embodiments, the selector pillar 400 may be formed by filling the via opening 122 with the material of the oxide layer 402 by a deposition process. For example, the deposition process may be or include a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), another applicable process, or a combination thereof. Then, a planarization process (e.g., chemical-mechanical-polishing (CMP) process or a grinding process) may be performed to remove the excess material of the oxide layer 402 outside of the via opening 122, and therefore the selector pillar 400 is obtained.

In other embodiments, as shown in FIGS. 6A and 6B, the selector pillar 400' may further include conductive layers 404, wherein the oxide layers 402 and the conductive layers 404 are disposed alternately in the via opening 122'. The via opening 122' is similar to the via opening 122, except that the via opening 122' has a larger width. In this embodiment, the oxide layer 402 and the conductive layer 404 both have a loop-shape from a top-view aspect, as shown in FIG. 6A. In this embodiment, the outermost of the selector pillar 400' is the conductive layer 404, that is, the conductive layer 404 is in direct contact with the sidewall contacts 108b, as shown in FIG. 6B. For example, the material of the conductive layer 404 may be titanium (Ti), titanium nitride (TiN), tungsten (W), tantalum nitride (TaN), or a combination thereof.

In some embodiments, the conductive layer 404 may have a fourth width W4 ranging from about 5 nm to about 15 nm. In this embodiment, a ratio of the distance between the bit lines 106b (i.e. the thickness of the insulating layer 102a) to the fourth width W4 is more than 10, so as to prevent crosstalk between adjacent memory cells, and therefore to increase the reliability of the three-dimensional resistive memory 10. In other words, the distance between adjacent memory cells (i.e., the thickness of the insulating layer 102*a*) is large enough to suppress the current leaking between the memory cells.

In some embodiments, the selector pillar 400' may be formed by alternatively depositing multiple successive layers of the material of the conductive layer 404 and the material of the oxide layer 402 in the via opening 122'. For example, the deposition process may be or include a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), another applicable process, or a combination thereof. Then, a planarization process (e.g., chemical-mechanical-polishing (CMP) process or a grinding process) may be performed to remove the excess material outside of the via opening 122', and therefore the selector pillar 400' is obtained.

FIGS. 6A and 6B show three conductive layers 404 and two oxide layers 402 for illustration purposes only, and the invention is not limited thereto. In other words, the numbers of the conductive layer 404 and the oxide layer 402 may be adjusted depending on the required characteristics of the actual product.

FIG. 7 shows the subsequent process for forming the three-dimensional resistive memory 10 continued with the structure of FIGS. 6A and 6B. It should be noted that the three-dimensional resistive memory 10 can also be formed by using the structure of FIGS. 5A and 5B. Next, referring to FIG. 7, in which the isolation layer 110 and the insulating layer 108*a* are not shown for clarity of illustration, a word line 500 is formed to electrically connect to the RRAM pillar 300. The method of forming the word line 500 is known to those having ordinary skill in the art, so the details are not iterated herein.

As shown in FIG. 7, the three-dimensional resistive memory 10 includes a resistive switching pillar 302, an electrode pillar 304 disposed within the resistive switching pillar 302, a stack of bit lines 106*b* adjacent to the resistive switching pillar 302, a plurality of sidewall contacts 108*b* between each of the bit lines 106*b* and the resistive switching pillar 302, and a selector pillar 400 extending through the stack of bit lines 106*b*. The bit lines 106*b* are separated vertically from each other by an insulating layer 106*a*. The selector pillar 400 contacts each of the sidewall contacts 108*b*. The selector pillar 400 is used to control the current direction. Since there is no need to use the poly silicon as the channel, the three-dimensional resistive memory 10 with the selector pillar 400 in the embodiment of the present disclosure potentially has a higher driving current as compared to those with the transistor. Furthermore, the three-dimensional resistive memory 10 with the selector pillar 400 in the embodiment of the present disclosure may be formed with simpler process steps as compared to those with the transistor.

In some embodiments, the selector pillar 400 includes at least an oxide layer 402, wherein the oxide layer comprises titanium oxide (TiO$_2$), zirconium oxide (ZrO$_2$), or a combination thereof. A Fowler-Nordheim tunneling barrier is obtained to achieve high nonlinear I-V curve, and furthermore, the conduction of the selector pillar 400 is temperature-independent while the sneak current problem can be avoided.

In some embodiments, the selector pillar 400' further includes at least a conductive layer 404. In some embodiments, the oxide layer 402 and the conductive layer 404 are disposed alternately, and the oxide layer 402 and the conductive layer 404 both have a loop-shape from a top-view aspect. In some embodiments, the conductive layer 404 has a forth width W4 ranging from about 3 nm to about 15 nm, and a distance between the bit lines 106*b* ranges from about 30 nm to about 200 nm, and a ratio of the distance to the forth width W4 is more than 10, so as to suppress the current leaking between the bit lines 106*b*, and therefore to increase the reliability of the three-dimensional resistive memory 10.

In summary, the three-dimensional resistive memory according to embodiments of the present disclosure includes a selector pillar to control the current direction. Since the selector pillar in the embodiments of the present disclosure is formed to have the Fowler-Nordheim tunneling effect, the driving current is temperature-independent and the sneak current problem can be avoided. In additional, since there is no need to use the poly silicon as the channel, the three-dimensional resistive memory with the selector pillar in the embodiment of the present disclosure can have a higher driving current as compare to those with the transistor, thereby improving the performance of the three-dimensional resistive memory. Furthermore, the three-dimensional resistive memory with the selector pillar in the embodiment of the present disclosure may be formed with simpler process steps as compared to those with the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional resistive memory, comprising:
   a resistive switching pillar;
   an electrode pillar disposed within the resistive switching pillar;
   a stack of bit lines adjacent to the resistive switching pillar, wherein the bit lines are separated vertically from each other by an insulating layer;
   a plurality of sidewall contacts between each of the bit lines and the resistive switching pillar, and
   a selector pillar extending through the stack of bit lines, wherein the selector pillar contacts each of the sidewall contacts.

2. The three-dimensional resistive memory of claim 1, wherein the selector pillar comprises at least an oxide layer.

3. The three-dimensional resistive memory of claim 2, wherein the oxide layer comprises titanium oxide, zirconium oxide, hafnium oxide, silicon dioxide, aluminum oxide, or a combination thereof.

4. The three-dimensional resistive memory of claim 2, wherein the oxide layer has a first thickness ranging from about 0.3 nm to about 20 nm.

5. The three-dimensional resistive memory of claim 2, wherein the selector pillar further comprises at least a conductive layer.

6. The three-dimensional resistive memory of claim 5, wherein the conductive layer comprises titanium (Ti), titanium nitride (TiN), tungsten (W), tantalum nitride (TaN) or a combination thereof.

7. The three-dimensional resistive memory of claim 4, wherein the conductive layer has a second thickness ranging from about 3 nm to about 15 nm, and a first distance between the bit lines ranges from about 30 nm to about 200 nm, wherein a ratio of the first distance to the second thickness is more than 10.

8. The three-dimensional resistive memory of claim 4, wherein the oxide layer and the conductive layer are disposed alternately, and the oxide layer and the conductive layer both have a loop-shape from a top-view aspect.

9. The three-dimensional resistive memory of claim 1, wherein the electrode pillar comprises, from periphery to center, an ion exchange layer, a barrier layer, and an electrode layer in sequence.

10. The three-dimensional resistive memory of claim 1, wherein the sidewall contacts comprise a same material as the bit lines.

11. The three-dimensional resistive memory of claim 1, further comprising a word line, wherein the word line is electrically connected to the electrode pillar.

12. A method for forming a three-dimensional resistive memory, comprising:
  forming a stack structure on a substrate, wherein the stack structure comprises a plurality of conductive layers and a plurality of insulating layers alternately stacked;
  patterning the stack structure to form a first stack portion and a second stack portion perpendicular to the first stack portion, wherein the first stack portion together with the second stack portion form a T-shape from a top-view aspect, and wherein the first stack portion comprises a stack of bit lines separated vertically from each other by the insulating layers, and the second stack portion comprises a plurality of sidewall contacts separated vertically from each other by the insulating layers;
  forming an isolation layer on the substrate bordering the first stack portion and the second stack portion;
  etching the isolation layer to form a first via opening exposing a first end of the second stack portion;
  sequentially forming a resistive switching pillar and an electrode pillar in the first via opening;
  etching the first stack portion to form a second via opening extending through the stack of bit lines and exposing a second end of the second stack portion; and
  forming a selector pillar in the second via opening, wherein the selector pillar contacts each of the sidewall contacts.

13. The method for forming a three-dimensional resistive memory of claim 12, wherein the selector pillar has a length along an extension direction of the first stack portion, and the second stack portion has a width along the extension direction of the first stack portion, wherein the length of the selector pillar is greater than or equal to the width of the second stack portion.

14. The method for forming a three-dimensional resistive memory of claim 12, wherein forming the selector pillar comprises forming at least an oxide layer.

15. The method for forming a three-dimensional resistive memory of claim 13, wherein the oxide layer comprises titanium oxide, zirconium oxide, hafnium oxide, silicon dioxide, aluminum oxide, or a combination thereof.

16. The method for forming a three-dimensional resistive memory of claim 13, wherein forming the selector pillar further comprises forming at least a conductive layer.

17. The method for forming a three-dimensional resistive memory of claim 15, wherein the conductive layer is in direct contact with the second end of the second stack portion.

18. The method for forming a three-dimensional resistive memory of claim 15, wherein the oxide layer and the conductive layer are disposed alternately, and the oxide layer and the conductive layer both have a loop-shape from the top-view aspect.

19. The method for forming a three-dimensional resistive memory of claim 12, wherein forming the electrode pillar comprises, from periphery to center, forming an ion exchange layer, a barrier layer, and an electrode layer in sequence.

20. The method for forming a three-dimensional resistive memory of claim 12, wherein the sidewall contacts comprise a same material as the bit lines.

* * * * *